United States Patent
Tian et al.

(10) Patent No.: US 11,715,436 B2
(45) Date of Patent: Aug. 1, 2023

(54) GOA CIRCUIT AND DISPLAY PANEL

(71) Applicant: Wuhan China Star Optoelectronics Technology Co., Ltd., Hubei (CN)

(72) Inventors: Chao Tian, Hubei (CN); Haiming Cao, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 316 days.

(21) Appl. No.: 17/281,600

(22) PCT Filed: Mar. 15, 2021

(86) PCT No.: PCT/CN2021/080735
§ 371 (c)(1),
(2) Date: Mar. 31, 2021

(87) PCT Pub. No.: WO2022/156050
PCT Pub. Date: Jul. 28, 2022

(65) Prior Publication Data
US 2023/0131128 A1    Apr. 27, 2023

(30) Foreign Application Priority Data

Jan. 19, 2021   (CN) .......................... 202110070225.4

(51) Int. Cl.
*G09G 3/36*    (2006.01)

(52) U.S. Cl.
CPC ... *G09G 3/3677* (2013.01); *G09G 2300/0819* (2013.01)

(58) Field of Classification Search
CPC . G09G 2310/0286; G09G 3/20; G09G 3/3677
See application file for complete search history.

(56) References Cited

U.S. PATENT DOCUMENTS

| | | | |
|---|---|---|---|
| 9,293,223 B2 * | 3/2016 | Ma | G11C 27/04 |
| 2010/0260312 A1 | 10/2010 | Tsai et al. | |
| 2021/0407356 A1 * | 12/2021 | Xue | G09G 3/20 |
| 2023/0075599 A1 * | 3/2023 | Kim | G09G 3/3266 |

FOREIGN PATENT DOCUMENTS

| | | |
|---|---|---|
| CN | 107799089 | 3/2018 |
| CN | 107871483 | 4/2018 |
| CN | 111627404 | 9/2020 |
| CN | 111754923 | 10/2020 |

* cited by examiner

*Primary Examiner* — Van N Chow (57) ABSTRACT

In a GOA circuit provided by the present disclosure, a unidirectional feedback circuit is adopted between a first node and a second node of the GOA circuit of the present disclosure, which can reduce complexity of circuit design, make it easier to achieve linear design and in-plane integration, prevent point competition of the first node and the second node, and improve stability of the circuit.

20 Claims, 3 Drawing Sheets

GOA CIRCUIT AND DISPLAY PANEL

RELATED APPLICATIONS

This application is a National Phase of PCT Patent Application No. PCT/CN2021/080735 having International filing date of Mar. 15, 2021, which claims the benefit of priority of Chinese Patent Application No. 202110070225.4 filed on Jan. 19, 2021. The contents of the above applications are all incorporated by reference as if fully set forth herein in their entirety.

FIELD AND BACKGROUND OF THE INVENTION

The present disclosure relates to the field of display technology, specifically to a GOA circuit and a display panel.

With increasing requirements of users for electronic gate driver on array (GOA) circuits, development of flexible bending display panels has attracted more and more attention. At present, liquid crystal display devices have been widely used in various electronic products as display components of electronic equipments, and the GOA circuit is an important part of the liquid crystal display devices. The GOA circuit is a technology that forms a gate line scan driving signal circuit on an array substrate using an existing thin film transistor liquid crystal display array substrate process, to achieve a scan method that scans gates line by line. Currently, the GOA circuit is mainly designed on both sides of a panel. With continuous development of full screen mobile phones, requirements for frames of display panels are higher and higher. At the same time, in face of applications such as vehicle mounted, appearances of displays are more diverse and complex. The current GOA design method has encountered a bottleneck when facing higher and higher demand. When a width of the GOA cannot be compressed, the frame of the panel cannot be reduced any more. In order to reduce the frame of the product panel, there is a special design of in-plane GOA, which is different from the existing technology in that the GOA circuit is disposed in a display area, rather than on both sides of the panel, so as to achieve a design close to borderless and improve competitiveness of products.

Figure 1:
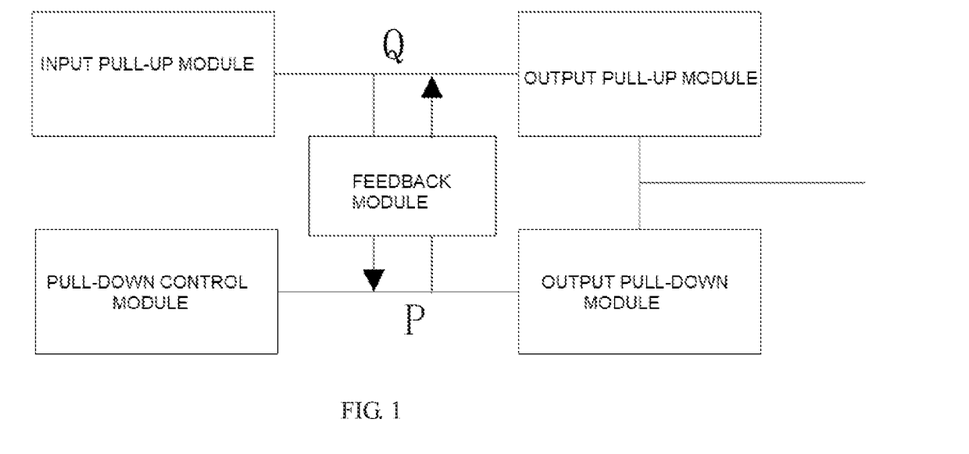
FIG. 1 is a schematic block diagram of a GOA circuit provided by the prior art.

As shown in FIG. 1 is a functional structural diagram of an existing GOA circuit. An input pull-up module, an output pull-up module, a pull-down control module, an output pull-down module, and a feedback module are connected to a node Q and a node P, respectively. The feedback module connecting the node Q and the node P adopts a bidirectional feedback design, which increases feedback complexity of the node P and the node Q, and will cause a result of bidirectional feedback between the node P and the node Q, which will reduce stability of the GOA circuit.

Therefore, there is a need to provide a GOA circuit to solve the problem existing in the prior art.

SUMMARY OF THE INVENTION

The present disclosure aims at providing a GOA circuit, which can set a unidirectional feedback circuit between a node P and a node Q, thereby preventing a result of bidirectional feedback and improving stability of the GOA circuit.

Specifically, the present disclosure provides a GOA circuit, wherein the GOA circuit comprises a plurality of cascaded circuit units, wherein an nth stage circuit unit comprises: an input pull-up module, wherein an input terminal of the input pull-up module receives a first control signal and outputs a first output signal to a first node, and an output terminal of the input pull-up module is connected to the first node; an output pull-up module, wherein an input terminal of the output pull-up module is connected to the first node, and an output terminal of the output pull-up module outputs an effective stage-transfer signal of the nth stage circuit unit; if the first node is at a high potential, the output pull-up module starts to work, and if the first node is at a low potential, the output pull-up module stops working; a pull-down control module, wherein an input terminal of the pull-down control module receives a second control signal and outputs a second output signal to a second node, and an output terminal of the pull-down control module is connected to the second node; an output pull-down module, wherein an input terminal of the output pull-down module is connected to the second node, and the output pull-down module is configured to pull the stage-transfer signal of the nth stage circuit unit to a low potential; if the second node is at a high potential, the output pull-down module starts to work, and if the second node is at a low potential, the output pull-down module stops working; a first feedback module, wherein an input terminal of the first feedback module is connected to the second node, an output terminal of the feedback module is connected to the first node, and the first feedback module is configured to control a voltage of the first node voltage according to the voltage of the second node; a mirror module, wherein the mirror module is a mirror unit of the input pull-up module, and an input terminal of the mirror module receives the first control signal and outputs the first output signal to a third node; and a second feedback module, wherein an input terminal of the second feedback module is connected to the third node, and an output terminal of the second feedback module is connected to the second node, and the second feedback module is configured to control a voltage of the second node according to a voltage of the third node; wherein the voltage of the second node and the voltage of the first node cannot be at a high potentials at the same time.

In addition, if the voltage of the second node is at a high potential, the first feedback module controls the first node to be at a low potential, and if the voltage of the third node is at a high potential, the second feedback module controls the second node to be at a low potential.

In addition, the first control signal comprises a stage-transfer signal of an (n−1)th stage circuit unit or an enable signal of an initial stage.

In addition, the nth stage circuit unit further comprises: a gate signal turn-off module configured to turn off a gate signal in the GOA circuit, wherein an input terminal of the gate signal turn-off module is connected to a third control signal, and an output terminal of the gate signal turn-off module is connected to an output terminal of the nth stage circuit unit.

In addition, the input pull-up module comprises a first thin film transistor; a gate of the first thin film transistor receives an (n+1)th stage clock signal, a source of the first thin film transistor receives a stage-transfer signal of an (n−1)th circuit unit or an enable signal of an initial stage, and a drain of the first thin film transistor is connected to the first node.

In addition, the output pull-up module comprises: a sixth thin film transistor, an eighth thin film transistor, and a first capacitor; a gate of the sixth thin film transistor receives a voltage signal, a source of the sixth thin film transistor is connected to the first node, and a drain of the sixth thin film transistor is connected to a first terminal of the first capacitor; a gate of the eighth thin film transistor is connected to the drain of the sixth thin film transistor and the first terminal of the first capacitor, a drain of the eighth thin film transistor receives the nth stage clock signal, and a source of the eighth thin film transistor is connected to an output terminal of the nth stage circuit unit; and a second terminal of the first capacitor is respectively connected to the output terminal of the nth stage circuit unit and the source of the eighth thin film transistor.

In addition, the pull-down control module comprises a seventh thin film transistor; a gate of the seventh thin film transistor receives an (n+1)th stage clock signal, a source of the seventh thin film transistor receives a the voltage signal, and a drain of the seventh thin film transistor is connected to the second node.

In addition, the output pull-down module comprises a ninth thin film transistor and a second capacitor; a gate of the ninth thin film transistor is respectively connected to a first terminal of the second capacitor and the second node, a source of the ninth thin film transistor is grounded, and a drain of the ninth thin film transistor is connected to an output terminal of the nth stage circuit unit; and a second terminal of the second capacitor is grounded.

In addition, the first feedback module comprises a fourth thin film transistor and a fifth thin film transistor; a source of the fourth thin film transistor is connected to the first node, and a gate of the fourth thin film transistor receives an nth stage clock signal; a source of the fifth thin film transistor is connected to a drain of the fourth thin film transistor, a drain of the fifth thin film transistor is grounded, and a gate of the fifth thin film transistor is connected to the second node.

In addition, the second feedback module comprises a second thin film transistor; a source of the second thin film transistor receives an (n+1)th stage clock signal, a drain of the second thin film transistor is connected to the second node, and a gate of the second thin film transistor is connected to the third node.

In addition, the mirror module comprises a third thin film transistor; a source of the third thin film transistor is connected to the third node, a gate of the third thin film transistor receives an (n+1)th stage clock signal, and a drain of the third thin film transistor receives a stage-transfer signal of an (n−1)th stage circuit unit or an enable signal of an initial stage.

In addition, the gate signal turn-off module comprises a tenth thin film transistor; a gate of the tenth thin film transistor receives the third control signal, a source of the tenth thin film transistor is grounded, and a drain of the tenth thin film transistor is connected to an output terminal of the nth stage circuit unit.

In addition, two circuit units constitute a minimum repeating unit of the GOA circuit.

The GOA circuit provided by the present disclosure sets a unidirectional feedback circuit between the first node and the second node, which can reduce complexity of circuit design, make it easier to achieve linear design and in-plane integration, prevent point competition of the first node and the second node, and improve stability of the circuit.

The present disclosure sets the first feedback module and the second feedback module, which are unidirectionally connected. The first feedback module is configured to collect the voltage of the second node, and control the voltage of the first node according to the voltage of the second node. The second feedback module is configured to control the voltage of the second node according to the voltage of the third node, and the voltage of the third node is provided by a mirror module of the input pull-up module, thereby achieving unidirectional control of the first node and the second node.

BRIEF DESCRIPTION OF THE SEVERAL VIEWS OF THE DRAWINGS

The following detailed description of specific implementations of the present disclosure in conjunction with the accompanying drawings will make the technical solutions and other beneficial effects of the present disclosure obvious.

DESCRIPTION OF SPECIFIC EMBODIMENTS OF THE INVENTION

Specific structure and functional details disclosed herein are only representative, and are used for the purpose of describing exemplary embodiments of the present disclosure. However, the present disclosure can be implemented in many alternative forms, and should not be construed as being limited only to the embodiments set forth herein.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined. In addition, the terms "including" and any vacations thereof are intended to cover non-exclusive inclusions.

Figure 2:
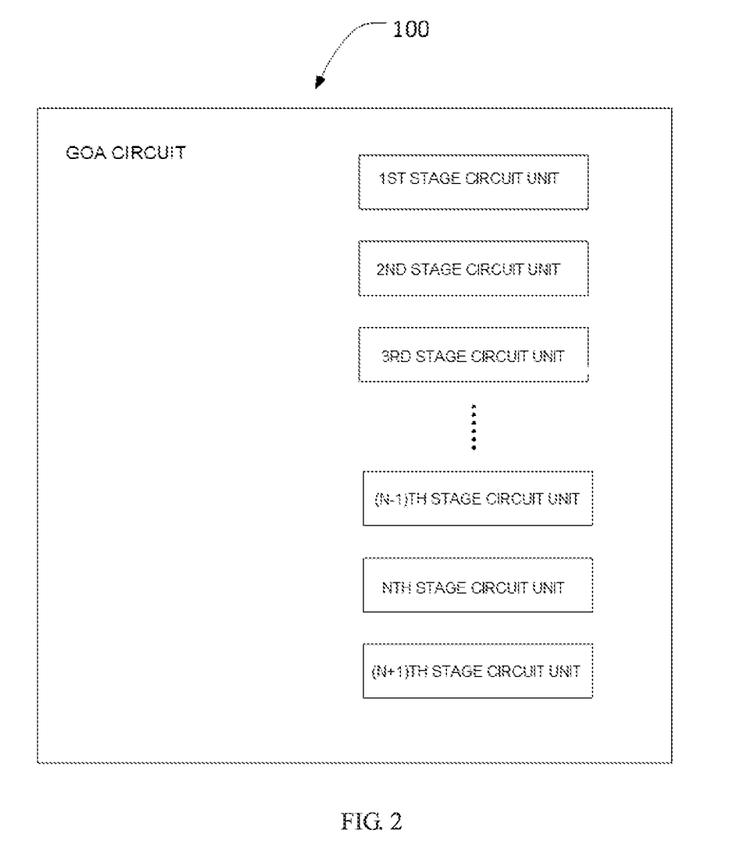
FIG. 2 is a schematic block diagram of a GOA circuit provided by an embodiment of the present disclosure.
Figure 3:
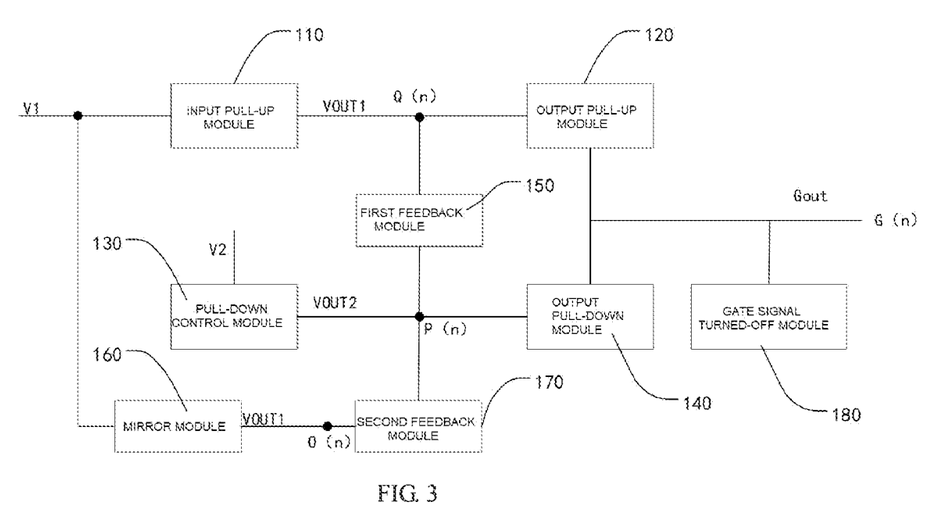
FIG. 3 is a schematic block diagram of an nth stage circuit power supply provided by an embodiment of the present disclosure.

As shown in FIG. 2 and FIG. 3, the present disclosure provides a GOA circuit 100 comprising a plurality of cascaded circuit units, wherein an nth stage circuit unit comprises: an input pull-up module 110, an output pull-up module 120, a pull-down control module 130, an output pull-down module 140, a first feedback module 150, a mirror module 160, and a second feedback module 170.

An input terminal of the input pull-up module 110 receives a first control signal V1 and outputs a first output signal VOUT1 to a first node Q(n), and an output terminal of the input pull-up module 110 is connected to the first node Q(n).

An input terminal of the output pull-up module 120 is connected to the first node Q(n), and an output terminal of the output pull-up module 120 outputs an effective stage-transfer signal G(n) of the nth stage circuit unit. If the first node Q(n) is at a high potential, the output pull-up module 120 starts to work, and if the first node Q(n) is at a low potential, the output pull-up module 120 stops working.

An input terminal of the pull-down control module 130 receives a second control signal V2 and outputs a second output signal VOUT2 to a second node P(n), and an output terminal of the pull-down control module 130 is connected to the second node P(n).

An input terminal of the output pull-down module 140 is connected to the second node P(n), and the output pull-down module 140 is configured to pull the stage-transfer signal of the nth stage circuit unit to a low potential. If the second node P(n) is at a high potential, the output pull-down module 140 starts to work, and if the second node P(n) is at a low potential, the output pull-down module 140 stops working.

An input terminal of the first feedback module 150 is connected to the second node P(n), and an output terminal of the feedback module 150 is connected to the first node Q(n). The first feedback module 150 is configured to collect a voltage of the second node P(n), and controls a voltage of the first node Q(n) according to the voltage of the second node P(n).

The mirror module 160 is a mirror unit of the input pull-up module 110, and an input terminal of the mirror module 160 receives the first control signal V1 and outputs the first output signal VOUT1 to a third node O(n).

An input terminal of the second feedback module 170 is connected to the third node O(n), and an output terminal of the second feedback module 170 is connected to the second node P(n). The second feedback module 170 is configured to control the voltage of the second node P(n) according to a voltage of the third node O(n). Wherein, the voltage of the second node P(n) and the voltage of the first node Q(n) cannot be at a high potential at the same time. If the voltage of the second node P(n) is at a high potential, the first feedback module 150 controls the first node to be at a low potential, and if the voltage of the third node O(n) is at a high potential, the second feedback module 170 controls the second node P(n) to be at a low potential.

A unidirectional feedback circuit is adopted between the first node Q(n) and the second node P(n) of the GOA circuit of the present disclosure, which can reduce complexity of circuit design, make it easier to achieve linear design and in-plane integration, prevent point competition of the first node Q(n) and the second node P(n), and improve stability of the GOA circuit.

Figure 4:
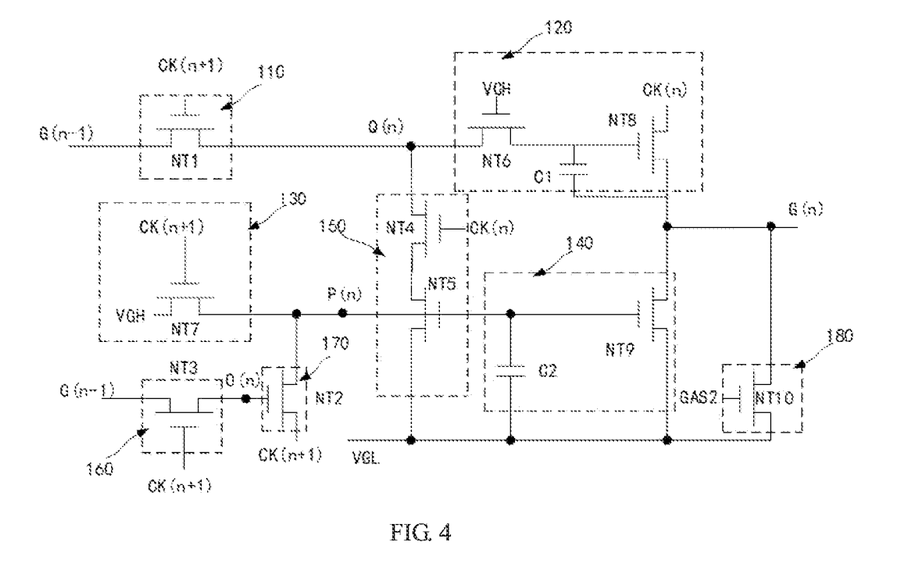
FIG. 4 is a specific connection diagram of the nth stage circuit power supply provided by an embodiment of the present disclosure.

As shown in FIG. 3 and FIG. 4. The following will describe in detail a special circuit connection diagram of an embodiment of the GOA circuit in the present disclosure.

The input pull-up module 110 comprises a first thin film transistor NT1. A gate of the first thin film transistor NT1 receives an (n+1)th stage clock signal CK(n+1), a source of the first thin film transistor NT1 receives a stage-transfer signal G(n−1) of an (n−1)th circuit unit or an enable signal of an initial stage, and a drain of the first thin film transistor NT1 is connected to the first node Q(n).

The output pull-up module 120 comprises: a sixth thin film transistor NT6, an eighth thin film transistor NT8, and a first capacitor C1. A gate of the sixth thin film transistor NT6 receives a voltage signal VGH, a source of the sixth thin film transistor NT6 is connected to the first node Q(n), and the drain of the sixth thin film transistor NT6 is connected to a first terminal of the first capacitor C1. A gate of the eighth thin film transistor NT8 is connected to the drain of the sixth thin film transistor NT6 and the first terminal of the first capacitor C1, a drain of the eighth thin film transistor NT8 receives an nth stage clock signal CK(n), and a source of the eighth thin film transistor NT8 is connected to an output terminal Gout of the nth stage circuit unit. A second terminal of the first capacitor C1 is respectively connected to the output terminal Gout of the nth stage circuit unit and the source of the eighth thin film transistor NT8.

The pull-down control module 130 comprises a seventh thin film transistor NT7. A gate of the seventh thin film transistor NT7 receives the (n+1)th stage clock signal CK(n+1), a source of the seventh thin film transistor NT7 receives the voltage signal VGH, and a drain of the seventh thin film transistor NT7 is connected to the second node P(n).

The output pull-down module 140 comprises a ninth thin film transistor NT9 and a second capacitor C2. A gate of the ninth thin film transistor NT9 is respectively connected to a first terminal of the second capacitor C2 and the second node P(n), a source of the ninth thin film transistor NT9 is grounded to VGL, and a drain of the ninth thin film transistor NT9 is connected to the output terminal Gout of the nth stage circuit unit. A second terminal of the second capacitor C2 is grounded to VGL.

The first feedback module 150 comprises a fourth thin film transistor NT4 and a fifth thin film transistor NT5. A source of the fourth thin film transistor NT4 is connected to the first node Q(n), and a gate of the fourth thin film transistor NT4 receives the nth stage clock signal CK(n). A source of the fifth thin film transistor NT5 is connected to a drain of the fourth thin film transistor NT4, a drain of the fifth thin film transistor NT5 is grounded, and a gate of the fifth thin film transistor NT5 is connected to the second node P(n).

The mirror module 160 comprises a third thin film transistor NT3. A source of the third thin film transistor NT3 is connected to the third node O(n), a gate of the third thin film transistor NT3 receives the (n+1)th stage clock signal CK(n+1), and a drain of the third thin film transistor NT3 receives the stage-transfer signal G(n−1) of the (n−1)th stage circuit unit or the enable signal of the initial stage.

The second feedback module 170 comprises a second thin film transistor NT2. A source of the second thin film transistor NT2 receives the (n+1)th stage clock signal CK(n+1), a drain of the second thin film transistor NT2 is connected to the second node P(n), and a gate of the second thin film transistor NT2 is connected to the third node O(n).

In an embodiment, the n-th stage circuit unit further comprises a gate signal turn-off module 180. An input terminal of the gate signal turn-off module 180 is connected to a third control signal GAS2, and an output terminal of the gate signal turn-off module is connected to the output terminal Gout of the nth stage circuit unit, and is configured to turn off a gate signal in the GOA circuit. The gate signal turn-off module comprises a tenth thin film transistor NT10, wherein a gate of the tenth thin film transistor receives the third control signal GAS2, a source of the tenth thin film transistor NT10 is grounded, and a drain of the tenth thin film transistor NT10 is connected to the output terminal Gout of the nth stage circuit unit.

A unidirectional feedback circuit is adopted between the first node Q(n) and the second node P(n) of the GOA circuit of this embodiment, which can reduce complexity of circuit design, make it easier to achieve linear design and in-plane integration, prevent point competition of the first node Q(n) and the second node P(n), and improve stability of the GOA circuit.

Specifically, in this embodiment, the first feedback module 150 and the second feedback module 170, which are unidirectionally connected, are provided, and the first feedback module 150 is configured to collect the voltage of the second node P(n), and control the voltage of the first node Q(n) according to the voltage of the second node P(n). The second feedback module 170 is configured to control the voltage of the second node P(n) according to the voltage of the third node O(n), and the voltage of the third node O(n) is provided by a mirror module of the input pull-up module, thereby achieving unidirectional control of the first node Q(n) and the second node P(n).

Since the first node Q(n) and the second node P(n) respectively control the output pull-up module 120 and the output pull-down module 140, when the output pull-up module 120 is working, the output pull-down module 140 cannot output, so the present disclosure uses a unidirectional feedback circuit to prevent the GOA circuit abnormality caused by the simultaneous operation of the output pull-up module 120 and the output pull-down module 140.

In the above-mentioned embodiments, the description of each embodiment has its own emphasis. For parts that are not described in detail in an embodiment, reference may be made to related descriptions of other embodiments.

Figure 5:
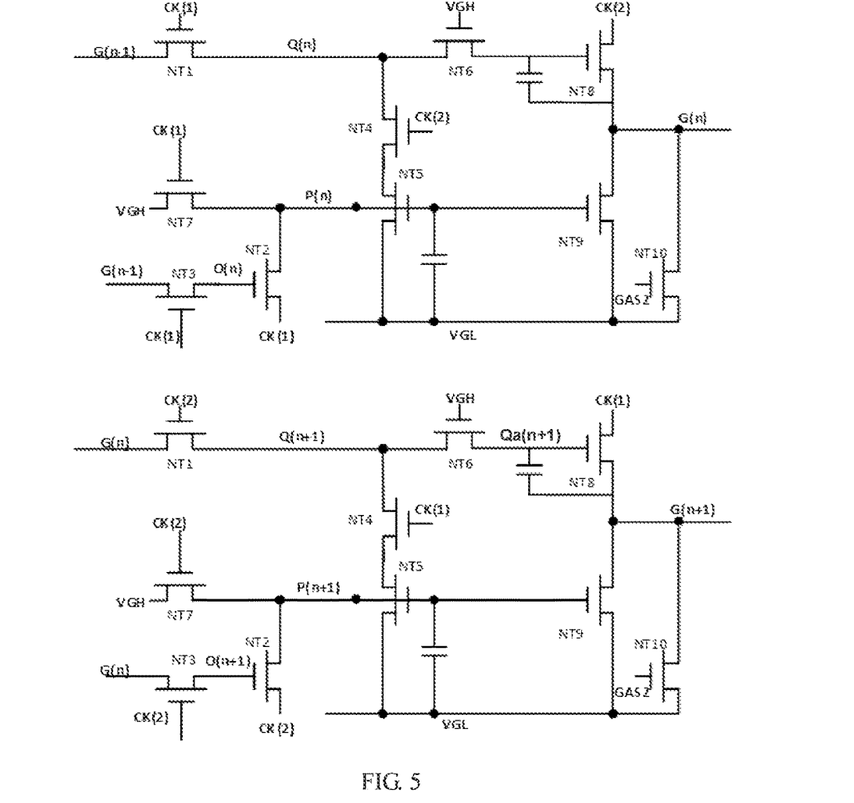
FIG. 5 is a specific connection diagram of a minimum repeating unit of the GOA circuit provided by an embodiment of the present disclosure.

As shown in FIG. 5, in another embodiment, two circuit units constitute a minimum repeating unit of the GOA circuit, which is composed of two consecutive basic units in FIG. 4. In another embodiment, specifically, the nth stage unit and the (n+1)th stage unit constitute the minimum repeating unit of the GOA circuit.

Figure 6:
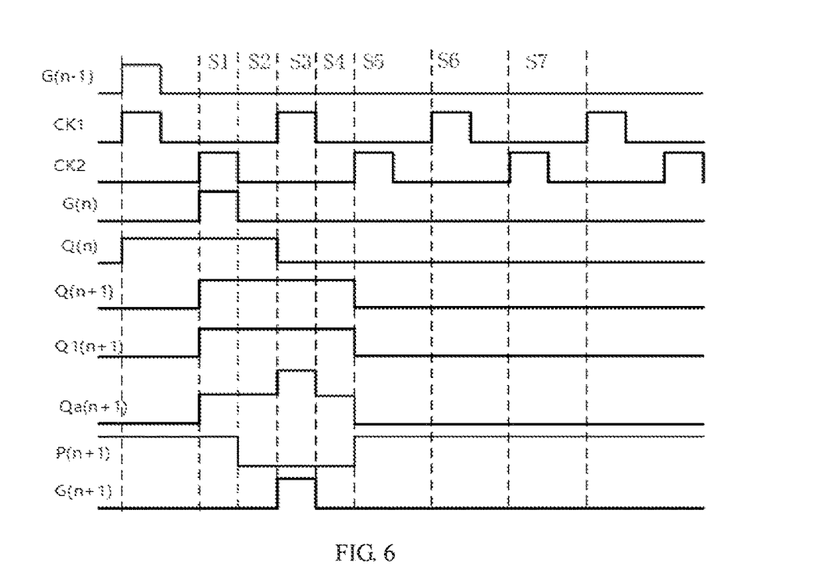
FIG. 6 is a timing control diagram of the GOA circuit provided by an embodiment of the present disclosure.

As shown in FIG. 6, in conjunction with the minimum repeating unit provided by the another embodiment of FIG. 5, the following description is made taking the (n+1)th stage circuit unit as an example.

In a first period S1, during a period when the stage-transfer signal G(n) of the nth stage circuit unit is at a high potential, a clock signal CK2 is at a high potential, and a clock signal CK1 is at a low potential, the first thin film transistor NT1, the third thin film transistor NT3, and the seventh thin film transistor NT7 are turned on, and a node Q(n+1), a node O(n+1), and a node P(n+1) are all at high potentials. At this time, the second thin film transistor NT2, the fifth thin film transistor NT5, the seventh thin film transistor NT7, the eighth thin film transistor NT8, and the ninth thin film transistor NT9 are all turned on, the second thin film transistor NT2 inputs a high voltage to the node P(n+1) at the same time, and the eighth thin film transistor NT8 and the ninth thin film transistor NT9 simultaneously pull down the effective stage-transfer signal G(n+1) of the (n+1)th stage circuit unit. At the same time, the fourth thin film transistor NT4 is turned off, and the node P(n+1) has no effect on the node Q(n+1).

In a second period S2, a falling edge of the clock signal CK2 changes to a low potential, the first thin film transistor NT1, the third thin film transistor NT3, and the seventh thin film transistor NT7 are all turned off, the node Q(n+1) and the node O(n+1) are at high potentials, the second thin film transistor NT2 is turned on, and the clock signal CK2 is at a low potential, so that the node P(n+1) is pulled down to a low potential; the fifth thin film transistor NT5 and the ninth thin film transistor NT9 are turned off, the seventh thin film transistor NT7 and the eighth thin film transistor NT8 are turned on, and the clock signal CK1 is still low, and therefore the effective stage-transfer signal G(n+1) of the (n+1)th stage circuit unit outputs a low potential.

In a third period S3, a rising edge of the clock signal CK1 changes to a high potential, the node Q(n+1) and the node O(n+1) are at high potentials, the node P(n+1) is at a low potential, the eighth thin film transistor NT8 outputs a high voltage signal to the effective stage-transfer signal G(n+1) of the (n+1)th stage circuit unit, and due to a bootstrap effect of the capacitor, a voltage of a node Qa(n+1) is raised.

In a fourth period S4, a falling edge of the clock signal CK1 changes to a low potential, the node Q(n+1) and the node O(n+1) are at high potentials, the node P(n+1) is at a low potential, the eighth thin film transistor NT8 outputs a low voltage signal to the effective stage-transfer signal G(n+1) of the (n+1)th stage circuit unit, and the voltage of the node Qa(n+1) drops to an original voltage.

In a fifth period S5, the clock signal CK2 changes a high potential, the first thin film transistor NT1, the third thin film transistor NT3, and the seventh thin film transistor NT7 are turned on, and the effective stage-transfer signal G(n) of the nth stage is at a low potential, so the node Q(n+1), the node Qa(n+1), and node O(n+1) are at low potentials, the node P(n+1) is at a high potential, the eighth thin film transistor NT8 is turned off, the fifth thin film transistor NT5 and the ninth thin film transistor NT9 are turned on, and the ninth thin film transistor NT9 pulls down the effective stage-transfer signal G(n+1) of the (n+1)th stage.

In a sixth period S6, the clock signal CK1 changes to a high potential, the first thin film transistor NT1, the third thin film transistor NT3, and the seventh thin film transistor NT7 are turned off, the node Q(n+1) and the node O(n+1) are at low potentials, the node P(n+1) is at a high potential, the fourth thin film transistor NT4, the fifth thin film transistor NT5, and the ninth thin film transistor NT9 are turned on, the ninth thin film transistor NT9 pulls down the effective stage-transfer signal G(n+1) of the (n+1)th stage circuit unit, and the fourth thin film transistor NT4 and the fifth thin film transistor NT5 pull down the node Q(n+1) to a low potential to prevent the eighth thin film transistor NT8 from outputting incorrectly due to clock signal CK1 becoming high.

In a seventh period S7, the clock signal CK2 changes to a high potential, the first thin film transistor NT1, the third thin film transistor NT3, and the seventh thin film transistor NT7 are all turned on, and the effective stage-transfer signal G(n) of the nth stage circuit unit is at a low potential, so that the node Q(n+1) and the node O(n+1) are at low potentials, the node P(n+1) is at a high potential, the eighth thin film transistor NT8 is turned off, the fifth thin film transistor NT5 and the ninth thin film transistor NT9 are turned on, and the ninth thin film transistor NT9 pulls down the effective stage-transfer signal G(n+1) of the (n+1)th stage circuit unit to a low potential.

The present disclosure further provides a display panel comprising the GOA circuit.

In summary, although preferred embodiments have been described above in the present disclosure, the above-mentioned preferred embodiments are not intended to limit the present disclosure. Those of ordinary skill in the art can make various modifications and changes without departing from the spirit and scope of the present disclosure. Therefore, the protection scope of the present disclosure is subject to the scope defined by the claims.

What is claimed is:

1. A gate driver on array (GOA) circuit, wherein the GOA circuit comprises a plurality of cascaded circuit units, wherein an nth stage circuit unit comprises:

an input pull-up module, wherein an input terminal of the input pull-up module receives a first control signal and outputs a first output signal to a first node, and an output terminal of the input pull-up module is connected to the first node;

an output pull-up module, wherein an input terminal of the output pull-up module is connected to the first node, and an output terminal of the output pull-up module outputs a stage-transfer signal of the nth stage circuit unit; if the first node is at a high potential, the output pull-up module starts to work, and if the first node is at a low potential, the output pull-up module stops working;

a pull-down control module, wherein an input terminal of the pull-down control module receives a second control signal and outputs a second output signal to a second node, and an output terminal of the pull-down control module is connected to the second node;

an output pull-down module, wherein an input terminal of the output pull-down module is connected to the second node, and the output pull-down module is configured to pull the stage-transfer signal of the nth stage circuit unit to a low potential; if the second node is at a high potential, the output pull-down module starts to work, and if the second node is at a low potential, the output pull-down module stops working;

a first feedback module, wherein an input terminal of the first feedback module is connected to the second node, an output terminal of the feedback module is connected to the first node, and the first feedback module is configured to control a voltage of the first node according to a voltage of the second node;

a mirror module, wherein the mirror module is a mirror unit of the input pull-up module, and an input terminal of the mirror module receives the first control signal and outputs the first output signal to a third node; and a second feedback module, wherein an input terminal of the second feedback module is connected to the third node, and an output terminal of the second feedback module is connected to the second node, and the second feedback module is configured to control the voltage of the second node according to a voltage of the third node; wherein the voltage of the second node and the voltage of the first node cannot be at high potentials at the same time.

2. The GOA circuit of claim 1, wherein,
if the voltage of the second node is at a high potential, the first feedback module controls the first node to be at a low potential, and
if the voltage of the third node is at a high potential, the second feedback module controls the second node to be at a low potential.

3. The GOA circuit of claim 1, wherein,
the first control signal comprises a stage-transfer signal of an (n−1)th stage circuit unit or an enable signal of an initial stage.

4. The GOA circuit of claim 1, wherein the nth stage circuit unit further comprises:
a gate signal turn-off module configured to turn off a gate signal in the GOA circuit, wherein an input terminal of the gate signal turn-off module is connected to a third control signal, and an output terminal of the gate signal turn-off module is connected to an output terminal of the nth stage circuit unit.

5. The GOA circuit of claim 1, wherein,
the input pull-up module comprises a first thin film transistor;
a gate of the first thin film transistor receives an (n+1)th stage clock signal, a source of the first thin film transistor receives a stage-transfer signal of an (n−1)th circuit unit or an enable signal of an initial stage, and a drain of the first thin film transistor is connected to the first node.

6. The GOA circuit of claim 1, wherein,
the output pull-up module comprises: a sixth thin film transistor, an eighth thin film transistor, and a first capacitor;
a gate of the sixth thin film transistor receives a voltage signal, a source of the sixth thin film transistor is connected to the first node, and a drain of the sixth thin film transistor is connected to a first terminal of the first capacitor;
a gate of the eighth thin film transistor is connected to the drain of the sixth thin film transistor and the first terminal of the first capacitor, a drain of the eighth thin film transistor receives an nth stage clock signal, and a source of the eighth thin film transistor is connected to an output terminal of the nth stage circuit unit; and
a second terminal of the first capacitor is respectively connected to the output terminal of the nth stage circuit unit and the source of the eighth thin film transistor.

7. The GOA circuit of claim 1, wherein,
the pull-down control module comprises a seventh thin film transistor;
a gate of the seventh thin film transistor receives an (n+1)th stage clock signal, a source of the seventh thin film transistor receives a voltage signal, and a drain of the seventh thin film transistor is connected to the second node.

8. The GOA circuit of claim 1, wherein,
the output pull-down module comprises a ninth thin film transistor and a second capacitor;
a gate of the ninth thin film transistor is respectively connected to a first terminal of the second capacitor and the second node, a source of the ninth thin film transistor is grounded, and a drain of the ninth thin film transistor is connected to an output terminal of the nth stage circuit unit; and
a second terminal of the second capacitor is grounded.

9. The GOA circuit of claim 1, wherein,
the first feedback module comprises a fourth thin film transistor and a fifth thin film transistor;
a source of the fourth thin film transistor is connected to the first node, and a gate of the fourth thin film transistor receives an nth stage clock signal;
a source of the fifth thin film transistor is connected to a drain of the fourth thin film transistor, a drain of the fifth thin film transistor is grounded, and a gate of the fifth thin film transistor is connected to the second node.

10. The GOA circuit of claim 1, wherein,
the second feedback module comprises a second thin film transistor;
a source of the second thin film transistor receives an (n+1)th stage clock signal, a drain of the second thin film transistor is connected to the second node, and a gate of the second thin film transistor is connected to the third node.

11. The GOA circuit of claim 1, wherein,
the mirror module comprises a third thin film transistor;
a source of the third thin film transistor is connected to the third node, a gate of the third thin film transistor receives an (n+1)th stage clock signal, and a drain of the third thin film transistor receives a stage-transfer signal of an (n−1)th stage circuit unit or an enable signal of an initial stage.

12. The GOA circuit of claim 4, wherein,
the gate signal turn-off module comprises a tenth thin film transistor;
a gate of the tenth thin film transistor receives the third control signal, a source of the tenth thin film transistor is grounded, and a drain of the tenth thin film transistor is connected to the output terminal of the nth stage circuit unit.

13. The GOA circuit of claim 1, wherein,
two of the circuit units constitute a minimum repeating unit of the GOA circuit.

14. A display panel comprising a gate driver on array (GOA) circuit, wherein the GOA circuit comprises a plurality of cascaded circuit units, wherein an nth stage circuit unit comprises:
an input pull-up module, wherein an input terminal of the input pull-up module receives a first control signal and outputs a first output signal to a first node, and an output terminal of the input pull-up module is connected to the first node;
an output pull-up module, wherein an input terminal of the output pull-up module is connected to the first node, and an output terminal of the output pull-up module outputs a stage-transfer signal of the nth stage circuit unit; if the first node is at a high potential, the output pull-up module starts to work, and if the first node is at a low potential, the output pull-up module stops working;
a pull-down control module, wherein an input terminal of the pull-down control module receives a second control signal and outputs a second output signal to a second node, and an output terminal of the pull-down control module is connected to the second node;
an output pull-down module, wherein an input terminal of the output pull-down module is connected to the second node, and the output pull-down module is configured to pull the stage-transfer signal of the nth stage circuit unit to a low potential; if the second node is at a high potential, the output pull-down module starts to work, and if the second node is at a low potential, the output pull-down module stops working;
a first feedback module, wherein an input terminal of the first feedback module is connected to the second node, an output terminal of the feedback module is connected to the first node, and the first feedback module is configured to control a voltage of the first node according to a voltage of the second node;
a mirror module, wherein the mirror module is a mirror unit of the input pull-up module, and an input terminal of the mirror module receives the first control signal and outputs the first output signal to a third node; and
a second feedback module, wherein an input terminal of the second feedback module is connected to the third node, and an output terminal of the second feedback module is connected to the second node, and the second feedback module is configured to control the voltage of the second node according to a voltage of the third node; wherein the voltage of the second node and the voltage of the first node cannot be at high potentials at the same time; if the voltage of the second node is at a high potential, the first feedback module controls the first node to be at a low potential, and if the voltage of the third node is at a high potential, the second feedback module controls the second node to be at a low potential; and the first control signal comprises a stage-transfer signal of an (n−1)th stage circuit unit or an enable signal of an initial stage.

15. The display panel of claim 14, wherein,
the input pull-up module comprises a first thin film transistor;
a gate of the first thin film transistor receives an (n+1)th stage clock signal, a source of the first thin film transistor receives the stage-transfer signal of the (n−1)th circuit unit or the enable signal of the initial stage, and a drain of the first thin film transistor is connected to the first node.

16. The display panel of claim 14, wherein,
the output pull-up module comprises: a sixth thin film transistor, an eighth thin film transistor, and a first capacitor;
a gate of the sixth thin film transistor receives a first voltage signal, a source of the sixth thin film transistor is connected to the first node, and a drain of the sixth thin film transistor is connected to a first terminal of the first capacitor;
a gate of the eighth thin film transistor is connected to the drain of the sixth thin film transistor and the first terminal of the first capacitor, a drain of the eighth thin film transistor receives an nth stage clock signal, and a source of the eighth thin film transistor is connected to an output terminal of the nth stage circuit unit; and
a second terminal of the first capacitor is respectively connected to the output terminal of the nth stage circuit unit and the source of the eighth thin film transistor.

17. The display panel of claim 14, wherein,
the pull-down control module comprises a seventh thin film transistor;
a gate of the seventh thin film transistor receives an (n+1)th stage clock signal, a source of the seventh thin film transistor receives a voltage signal, and a drain of the seventh thin film transistor is connected to the second node.

18. The display panel of claim 14, wherein,
the output pull-down module comprises a ninth thin film transistor and a second capacitor;
a gate of the ninth thin film transistor is respectively connected to a first terminal of the second capacitor and the second node, a source of the ninth thin film transistor is grounded, and a drain of the ninth thin film transistor is connected to an output terminal of the nth stage circuit unit; and
a second terminal of the second capacitor is grounded.

19. The display panel of claim 14, wherein,
the first feedback module comprises a fourth thin film transistor and a fifth thin film transistor;
a source of the fourth thin film transistor is connected to the first node, and a gate of the fourth thin film transistor receives an nth stage clock signal;
a source of the fifth thin film transistor is connected to a drain of the fourth thin film transistor, a drain of the fifth thin film transistor is grounded, and a gate of the fifth thin film transistor is connected to the second node;
the second feedback module comprises a second thin film transistor;
a source of the second thin film transistor receives an (n+1)th stage clock signal, a drain of the second thin film transistor is connected to the second node, and a gate of the second thin film transistor is connected to the third node;
the mirror module comprises a third thin film transistor;

a source of the third thin film transistor is connected to the third node, a gate of the third thin film transistor receives the (n+1)th stage clock signal, and a drain of the third thin film transistor receives the stage-transfer signal of the (n−1) the stage circuit unit or the enable signal of the initial stage.

20. The display panel of claim 14, wherein the nth stage circuit unit further comprises:
a gate signal turn-off module configured to turn off a gate signal in the GOA circuit, wherein an input terminal of the gate signal turn-off module is connected to a third control signal, and an output terminal of the gate signal turn-off module is connected to an output terminal of the nth stage circuit unit;
the gate signal turn-off module comprises a tenth thin film transistor; and
a gate of the tenth thin film transistor receives the third control signal, a source of the tenth thin film transistor is grounded, and a drain of the tenth thin film transistor is connected to the output terminal of the nth stage circuit unit.

* * * * *